US012658367B2

(12) United States Patent
Kowase et al.

(10) Patent No.: US 12,658,367 B2
(45) Date of Patent: Jun. 16, 2026

(54) CERAMIC ELECTRONIC COMPONENT, TAPED PACKAGE, CIRCUIT BOARD, AND METHOD FOR MANUFACTURING CERAMIC ELECTRONIC COMPONENT

(71) Applicant: TAIYO YUDEN CO., LTD., Tokyo (JP)

(72) Inventors: Yusuke Kowase, Tokyo (JP); Yuji Takita, Tokyo (JP); Maiko Yamane, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 129 days.

(21) Appl. No.: 18/532,597

(22) Filed: Dec. 7, 2023

(65) Prior Publication Data

US 2024/0194406 A1 Jun. 13, 2024

(30) Foreign Application Priority Data

Dec. 12, 2022 (JP) ................................. 2022-198146

(51) Int. Cl.
*H01G 4/30* (2006.01)
*H01G 2/06* (2006.01)
(Continued)

(52) U.S. Cl.
CPC ............. *H01G 4/012* (2013.01); *H01G 2/065* (2013.01); *H01G 4/0085* (2013.01);
(Continued)

(58) Field of Classification Search
CPC .... H01G 4/012; H01G 4/0085; H01G 4/2325; H01G 4/30; H01G 4/181; H01G 2201/10015; H01G 2/065
See application file for complete search history.

(56) References Cited

U.S. PATENT DOCUMENTS

2012/0307418 A1* 12/2012 Kim ...................... H01G 4/012
361/321.2
2014/0030736 A1 1/2014 Kim et al.
(Continued)

FOREIGN PATENT DOCUMENTS

JP H11-135355 A 5/1999
JP 2014-212295 A 11/2014

*Primary Examiner* — Michael P Mcfadden
(74) *Attorney, Agent, or Firm* — CHEN YOSHIMURA LLP

(57) ABSTRACT

A ceramic electronic component, in which a dimension in a first direction being equal to or greater than 1.3 times a dimension in a second direction perpendicular to the first direction, includes a multilayer chip having a plurality of internal electrode layers stacked in the first direction; and a pair of external electrodes provided on a first end surface and a second end surface, wherein in each of the plurality of internal electrode layers, a width of a connecting portion thereof connected to the corresponding external electrode in the second direction is narrower than a width of other regions of the internal electrode layer, and wherein in at least two adjacent internal electrode layers connected to the same one of the pair of external electrodes, side edges of the connecting portions in the second direction are shifted in position with respect to each other in the second direction.

9 Claims, 14 Drawing Sheets

Shift amount

(51) Int. Cl.
| | |
|---|---|
| *H01G 4/008* | (2006.01) |
| *H01G 4/012* | (2006.01) |
| *H01G 4/232* | (2006.01) |
| *H05K 1/181* | (2026.01) |

(52) U.S. Cl.
CPC ............. *H01G 4/2325* (2013.01); *H01G 4/30* (2013.01); *H05K 1/181* (2013.01); *H05K 2201/10015* (2013.01)

(56) References Cited

U.S. PATENT DOCUMENTS

| | | | |
|---|---|---|---|
| 2014/0307362 A1 | 10/2014 | Kim et al. | |
| 2016/0240317 A1* | 8/2016 | Ro | H01G 4/30 |
| 2017/0345571 A1* | 11/2017 | Imaeda | H01G 4/248 |
| 2019/0198249 A1* | 6/2019 | Sato | H05K 1/181 |
| 2019/0252119 A1* | 8/2019 | Hasegawa | H01G 4/012 |
| 2021/0104364 A1* | 4/2021 | Okuda | H01G 4/1218 |
| 2022/0262567 A1* | 8/2022 | Lee | H01G 4/012 |
| 2023/0207209 A1* | 6/2023 | Lee | H01G 4/30 |
| | | | 361/301.4 |
| 2023/0282418 A1* | 9/2023 | Nishibayashi | H01G 4/008 |
| | | | 361/301.4 |

* cited by examiner

100

10

20b

20a $T_0$ $L_0$ $W_0$

T

W

L

Shift amount

CERAMIC ELECTRONIC COMPONENT, TAPED PACKAGE, CIRCUIT BOARD, AND METHOD FOR MANUFACTURING CERAMIC ELECTRONIC COMPONENT

BACKGROUND OF THE INVENTION

Technical Field

The present invention relates to a ceramic electronic component, a taped package, a circuit board, and a method for manufacturing a ceramic electronic component.

Background Art

In recent years, electronic devices such as mobile information terminals have become smaller, and the mounting area of ceramic electronic components on a circuit board is being limited. On the other hand, as devices become more sophisticated, multilayer ceramic capacitors are required to have even larger capacitances.

RELATED ART DOCUMENT

Patent Document

Patent Document 1: Japanese Patent Application Laid-Open Publication No. 2014-212295
Patent Document 1: Japanese Patent Application Laid-Open Publication No. H11-135355

SUMMARY OF THE INVENTION

In order to increase the capacitance of multilayer ceramic capacitors, it is important to increase the total facing area of internal electrode layers. In particular, in order to increase the capacitance without increasing the mounting area, it is conceivable to increase the number of stacked internal electrode layers (see, for example, Patent Document 1). However, in the case of a shape in which the height direction dimension (T) is larger than the width direction dimension (W) in order to increase the number of laminated layers, element diffusion from the external electrode and internal electrode layers is promoted and the crack occurrence rate may be increased, which is undesirable.

It has been contemplated that element diffusion is restricted by reducing the width of the internal electrode layer, thereby reducing the contact area with the external electrode (see, for example, Patent Document 2).

However, in a tall structure in which the height direction dimension (T) is larger than the width direction dimension (W), the influence of the reduction in the filling rate due to the reduction in the width of the internal electrode layer becomes large, and portions where the internal electrodes are absent may become recessed, causing the rectangularity to be difficult to be maintained. Furthermore, due to the distorted structure as described above, when applying the external electrode, there is a risk that it will be cut at the ridges and the like, resulting in a defective product.

The present invention was made in view of the above problems, and an object of the present invention is to provide a ceramic electronic component, a taped package, a circuit board, and a method for manufacturing a ceramic electronic component that can suppress the occurrence of defects due to shape deformation.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a ceramic electronic component, a dimension in a first direction of the ceramic electronic component being equal to or greater than 1.3 times a dimension of the ceramic electronic component in a second direction that is perpendicular to the first direction, the ceramic electronic component comprising: a multilayer chip having a substantially rectangular parallelepiped shape in which a plurality of dielectric layers and a plurality of internal electrode layers are alternately stacked in the first direction, the plurality of internal electrode layers being alternately exposed to a first end surface and a second end surface, respectively, the first end surface and the second end surface facing each other in a third direction that is perpendicular to the first and second directions; and a pair of external electrodes provided on the first end surface and the second end surface, respectively, wherein in each of the plurality of internal electrode layers, a width of a connecting portion thereof connected to the corresponding external electrode in the second direction is narrower than a width of other regions of the internal electrode layer, and wherein in at least two adjacent internal electrode layers, among the plurality of internal electrode layers, that are connected to the same one of the pair of external electrodes, side edges of the connecting portions in the second direction are shifted in position with respect to each other in the second direction.

In the above described ceramic electronic component, $D/H$ may be 10% or more and 75% or less, where $D$ is an average value of amounts of positional shifts between a center of the multilayer chip in the second direction and a center of the connecting portions of the plurality of internal electrode layers in the second direction, and $H$ is an average value of the widths of the connecting portions of the plurality of internal electrode layers in the second direction.

In the above described ceramic electronic component, in each of the plurality of internal electrode layers, the width of the connecting portion may be 20% or more and 80% or less of a width of the internal electrode layer in an area where the internal electrode layers connected to different external electrodes face each other.

In the above described ceramic electronic component, a main component of the plurality of internal electrode layers may be nickel, and in each of the pair of external electrodes, a main component of a portion of the external electrode in contact with the first end surface or the second end surface may be copper.

In the above described ceramic electronic component, the side edges of the connecting portions of every two of the plurality of internal electrode layers may be shifted in position alternately in the second direction and in a direction opposite to the second direction.

In another aspect, the present disclosure provides a taped package, comprising: the above-described ceramic electronic component; a carrier tape having a sealing surface perpendicular to the first direction, and a recess that is recessed from the sealing surface in the first direction and that accommodates the ceramic electronic component; and a top tape affixed to the sealing surface and covering the recess.

In another aspect, the present disclosure provides a circuit board, comprising: the above-described ceramic electronic component; and a mounting board having a mounting surface perpendicular to the first direction, and a pair of connection electrodes provided on the mounting surface to which the pair of external electrodes of the ceramic electronic component are respectively connected via solder.

In another aspect, the present disclosure provides a method for manufacturing a ceramic electronic component whose dimension in a first direction is 1.3 times or more a dimension in a second direction perpendicular to the first direction, the method comprising: firing a laminate in which a plurality of laminate units each having an internal electrode pattern formed on a dielectric green sheet are stacked in the first direction; and forming a pair of external electrodes on a first end surface and a second end surface of the laminate, respectively, the first end surface and the second end surface facing each other in a third direction that is perpendicular to the first and second directions, the forming the pair of external electrodes being performed during the firing the laminate or after the firing the laminate, wherein in each of the plurality of internal electrode layers, a width of a connecting portion thereof connected to the corresponding external electrode in the second direction is narrower than a width of other regions of the internal electrode layer, and wherein in at least two adjacent internal electrode layers, among the plurality of internal electrode layers, that are connected to the same one of the pair of external electrodes, side edges of the connecting portions in the second direction are shifted in position with respect to each other in the second direction.

The above-described method may further include: before the firing the laminate, obtaining the laminate by laminating a plurality of the laminate units in the first direction and by affixing side margin sheets respectively on side surfaces of the laminated plurality of the laminate units.

In the above-described method, the side edges of the connecting portions of every two of the plurality of internal electrode layers may be shifted in position alternately in the second direction and in a direction opposite to the second direction.

According to the present invention, it is possible to provide a ceramic electronic component, a taped package, a circuit board, and a method for manufacturing a ceramic electronic component that can suppress the occurrence of defects due to shape deformation.

It is to be understood that both the foregoing general description and the following detailed description are exemplary and explanatory, and are intended to provide further explanation of the invention as claimed.

BRIEF DESCRIPTION OF THE DRAWINGS

FIGS. 8A and 8B are diagrams illustrating the first area and the second area.

DETAILED DESCRIPTION OF EMBODIMENTS

Hereinafter, embodiments will be described with reference to the drawings.

Embodiments

Figure 1:
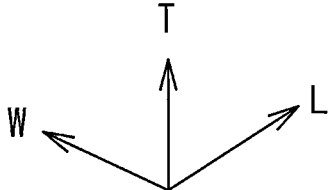
FIG. 1 is an external view of a multilayer ceramic capacitor according to an embodiment.

FIG. 1 is an external view of a multilayer ceramic capacitor 100 according to an embodiment. As illustrated in FIG. 1, the multilayer ceramic capacitor 100 includes a multilayer chip 10 having a substantially rectangular parallelepiped shape, and external electrodes 20a and 20b provided on two opposing end surfaces of the multilayer chip 10. Note that, of the four surfaces of the multilayer chip 10 other than the two end surfaces, two surfaces at both ends in the stacking direction are referred to as a top surface and a bottom surface. Two surfaces other than the two end surfaces, the top surface, and the bottom surface are referred to as side surfaces. The external electrodes 20a and 20b extend on the top surface and bottom surface in the stacking direction, and on two side surfaces of the multilayer chip 10. However, the external electrode 20a and the external electrode 20b are spaced apart from each other.

The T direction is the lamination direction of layers in the multilayer chip 10, is the height direction of the multilayer ceramic capacitor 100, and is the direction in which the top and bottom surfaces of the multilayer chip 10 face each other. The W direction is a direction in which two side surfaces of the multilayer chip 10 face each other. The L direction is a direction in which the two end surfaces of the multilayer chip 10 face each other, and is a direction in which the external electrodes 20a and 20b face each other. The L direction, W direction, and T direction are orthogonal to each other. As illustrated in FIG. 1, the height of the multilayer ceramic capacitor 100 in the T direction is defined as a height $T_0$, the width in the W direction is defined as a width $W_0$, and the length in the L direction is defined as a length $L_0$. Note that the height $T_0$, width $W_0$, and length $L_0$ are the maximum dimensions in the T direction, W direction, and L direction, respectively.

Figure 2:
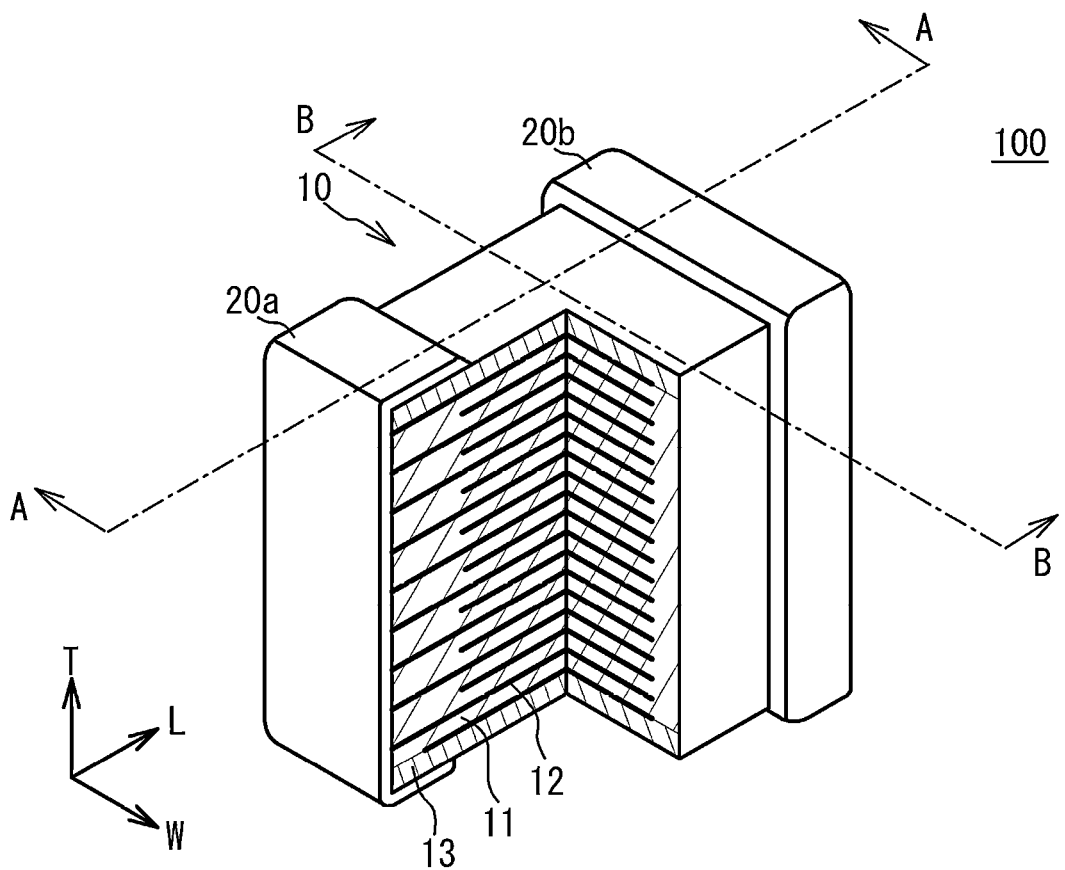
FIG. 2 is a partially cross-sectional perspective view of the multilayer ceramic capacitor according to the embodiment.
Figure 3:
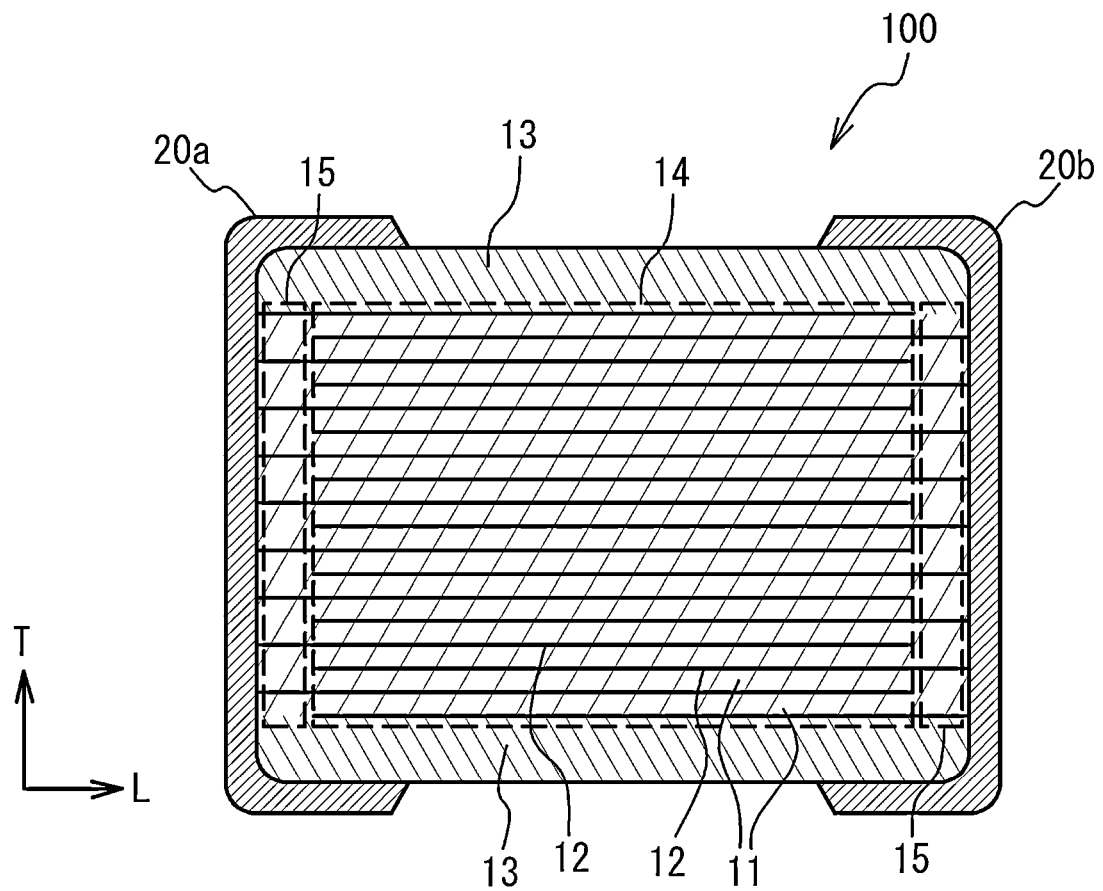
FIG. 3 is a sectional view taken along line A-A in FIG. 2.
Figure 4:
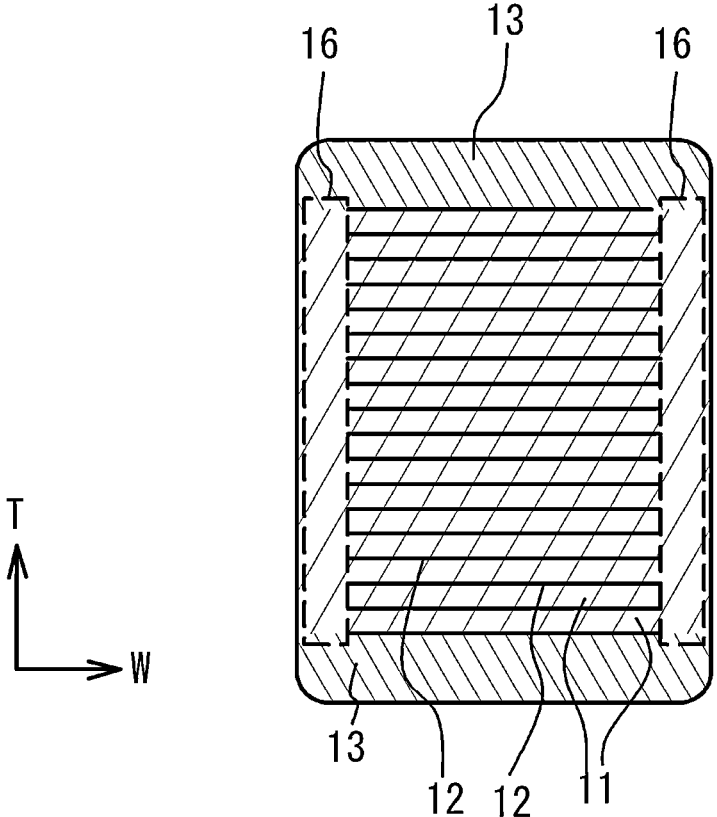
FIG. 4 is a sectional view taken along line B-B in FIG. 2.

FIG. 2 is a partially sectional perspective view of the multilayer ceramic capacitor 100. FIG. 3 is a cross-sectional view taken along line A-A in FIG. 2. FIG. 4 is a sectional view taken along line B-B in FIG. 2. As illustrated in FIGS. 2 to 4, the multilayer chip 10 has a structure in which dielectric layers 11 containing a ceramic material functioning as a dielectric and internal electrode layers 12 mainly composed of metal are laminated alternately. In other words, the multilayer chip 10 includes a plurality of internal electrode layers 12 facing each other and dielectric layers 11 each sandwiched between the plurality of internal electrode layers 12. The edges in the extending direction of the respective internal electrode layers 12 are exposed alternately to a first end surface where the external electrode 20a of the multilayer chip 10 is provided and a second end surface where the external electrode 20b is provided. The internal electrode layer 12 connected to the external electrode 20a is not connected to the external electrode 20b. The internal electrode layer 12 connected to the external electrode 20b is not connected to the external electrode 20a. Therefore, the respective internal electrode layers 12 are alternately electrically connected to the external electrodes 20a and 20b. Further, in the laminate of the dielectric layer 11 and the internal electrode layer 12, the top layer in the stacking direction is an internal electrode layer 12, and the bottom layer in the stacking direction is also an internal electrode layer 12. Each of the two these surfaces is covered with a cover layer 13. The cover layer 13 has a ceramic material as its main component. For example, the main component of the cover layer 13 is the same as the main component of the dielectric layer 11.

The dielectric layer 11 has, for example, a ceramic material having a perovskite structure represented by the general formula $ABO_3$ as a main phase. Note that the perovskite structure includes $ABO_{3-\alpha}$ that deviates from the stoichiometric composition. For example, at least one of the following materials may be selected and used as the ceramic material: $BaTiO_3$ (barium titanate), $CaZrO_3$ (calcium zirconate), $CaTiO_3$ (calcium titanate), $SrTiO_3$ (strontium titanate), $MgTiO_3$ (magnesium titanate), $Ba_{1-x-y}Ca_xSr_yTi_{1-z}Zr_zO_3$ ($0 \leq x \leq 1$, $0 \leq y \leq 1$, $0 \leq z \leq 1$) that forms a perovskite structure. $Ba_{1-x-y}Ca_xSr_yTi_{1-z}Zr_zO_3$ may be, for example, barium strontium titanate, barium calcium titanate, barium zirconate, barium zirconate titanate, calcium zirconate titanate, and barium calcium zirconate titanate.

Additives may be added to the dielectric layer 11. The additives to the dielectric layer 11 may be magnesium (Mg), manganese (Mn), molybdenum (Mo), vanadium (V), chromium (Cr), oxides of rare earth elements (yttrium (Y), samarium (Sm), europium (Eu), gadolinium (Gd), terbium (Tb), dysprosium (Dy), holmium (Ho), erbium (Er), thulium (Tm) and ytterbium (Yb)), or oxides including cobalt (Co), nickel (Ni), lithium (Li), boron (B), sodium (Na), potassium (K) or silicon (Si), or glasses containing Co, Ni, Li, B, Na, K or Si.

The thickness of the dielectric layer 11 per layer in the T direction is, for example, 0.3 μm or more and 10 μm or less, or 0.4 μm or more and 8 μm or less, or 0.5 μm or more and 5 μm or less. The thickness of the dielectric layer 11 per layer in the T direction is determined by measuring and averaging the thickness at 10 points from an image taken with a microscope such as a scanning transmission electron microscope after exposing the cross section of the multilayer ceramic capacitor 100 shown in FIG. 3 by mechanical polishing, for example.

The main component of the internal electrode layer 12 is a base metalm such as Ni, copper (Cu), and tin (Sn), or alloys containing these metals. As the main component of the internal electrode layer 12, noble metals such as platinum (Pt), palladium (Pd), silver (Ag), gold (Au), or alloys containing these may be used. The thickness of each internal electrode layer 12 in the T direction is, for example, 0.1 μm or more and 2 μm or less, 0.2 μm or more and 1 μm or less, or 0.3 μm or more and 0.8 μm or less. The thickness in the T direction of the internal electrode layer 12 per layer is determined by measuring and averaging the thickness at 10 points from an image taken with a microscope such as a scanning transmission electron microscope after exposing the cross section of the multilayer ceramic capacitor 100 shown in FIG. 3 by mechanical polishing, for example.

As illustrated in FIG. 3, the region where the internal electrode layer 12 connected to the external electrode 20a and the internal electrode layer 12 connected to the external electrode 20b face each other is a region where capacitance occurs in the multilayer ceramic capacitor 100. Therefore, the region where the capacitance occurs is referred to as a capacitor section 14. That is, the capacitor section 14 is a region where adjacent internal electrode layers connected to different external electrodes face each other.

A region where the internal electrode layers 12 connected to the external electrode 20a face each other without interposing the internal electrode layer 12 connected to the external electrode 20b is referred to as an end margin 15. Further, a region where the internal electrode layers 12 connected to the external electrode 20b face each other without interposing the internal electrode layer 12 connected to the external electrode 20a is also referred to as an end margin 15. That is, the end margin is a region where internal electrode layers connected to the same external electrode face each other without interposing an internal electrode layer connected to a different external electrode. The end margin 15 is an area where no capacitance occurs. The end margin 15 may have the same composition as the dielectric layer 11 of the capacitor section 14, or may have a different composition.

As illustrated in FIG. 4, in the multilayer chip 10, the regions from the side surface to the internal electrode layer 12 in the W direction are referred to as side margins 16. That is, the side margins 16 are regions provided so as to cover the edges of the plurality of stacked internal electrode layers 12 respectively extending on two side surfaces in the multiplayer structure. The side margin 16 is also an area where no electrostatic capacitance occurs. The side margin 16 may have the same composition as the dielectric layer 11 of the capacitor section 14, or may have a different composition.

Figure 5:
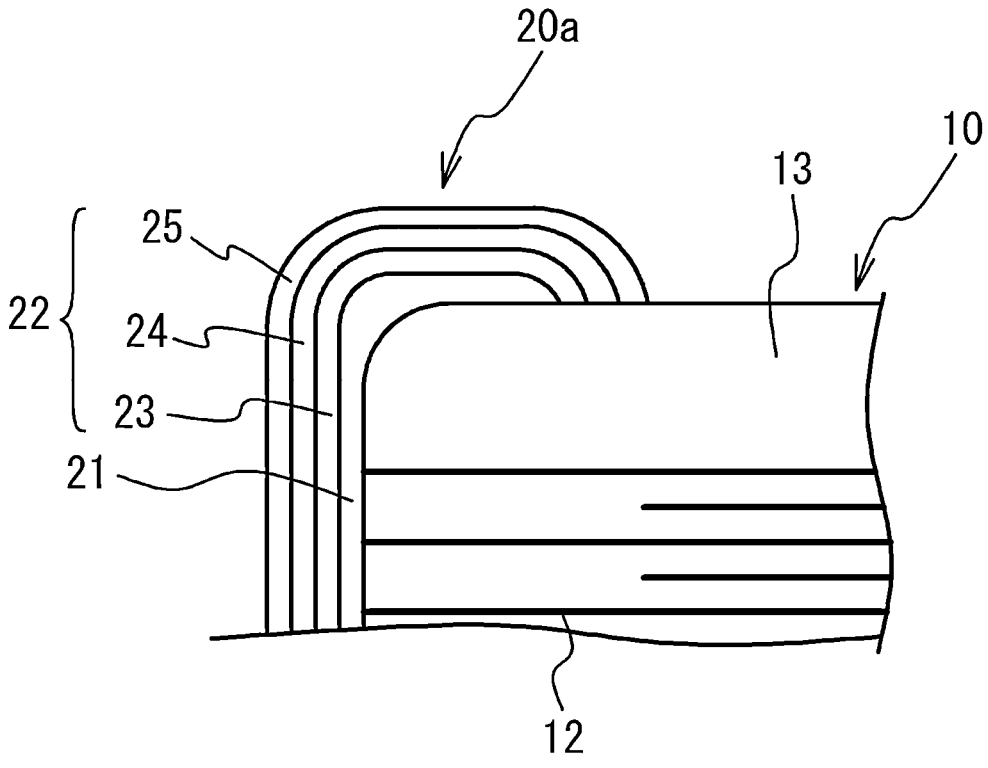
FIG. 5 is an enlarged cross-sectional view of the vicinity of an external electrode.

FIG. 5 is an enlarged cross-sectional view of the vicinity of the external electrode 20a. In FIG. 5, hatches are omitted. As illustrated in FIG. 5, the external electrode 20a has a structure in which a plating layer 22 is provided on a base layer 21. The base layer 21 has Cu as a main component. The base layer 21 may contain a glass component. The plating layer 22 mainly contains metals such as Ni, aluminum (Al), zinc (Zn), and Sn, or alloys of two or more of these metals. The plating layer 22 may be a plating layer of a single metal component, or may be a plurality of plating layers of mutually different metal components. For example, the plating layer 22 has a structure in which a first plating layer 23, a second plating layer 24, and a third plating layer 25 are formed in order from the base layer 21 side. The first plating layer 23 is, for example, a Sn plating layer. The second plating layer 24 is, for example, a Ni plating layer. The third plating layer 25 is, for example, a Sn plating layer. Note that although FIG. 5 illustrates the external electrode 20a, the external electrode 20b also has the same laminated structure.

In order to realize a large-capacitance multilayer ceramic capacitor, it is important to increase the total facing area of the internal electrode layers. In order to increase the capacitance without increasing the mounting area, it is conceivable to increase the number of stacked internal electrode layers. Therefore, in this embodiment, the number of stacked layers is increased by setting height $T_0 \geq$ width $W_0 \times 1.3$. With this configuration, the total opposing area of the internal electrode layers 12 increases, and so a large capacitance can be achieved. In addition, in the multilayer ceramic capacitor 100, the number of the stacked internal electrode layers 12 is, for example, about 50 or more and 1000 or less. Furthermore, in the multilayer ceramic capacitor 100, the stacking density of the internal electrode layers 12 is about 130 layers/mm or more and 2500 layers/mm or less.

Figure 6A:
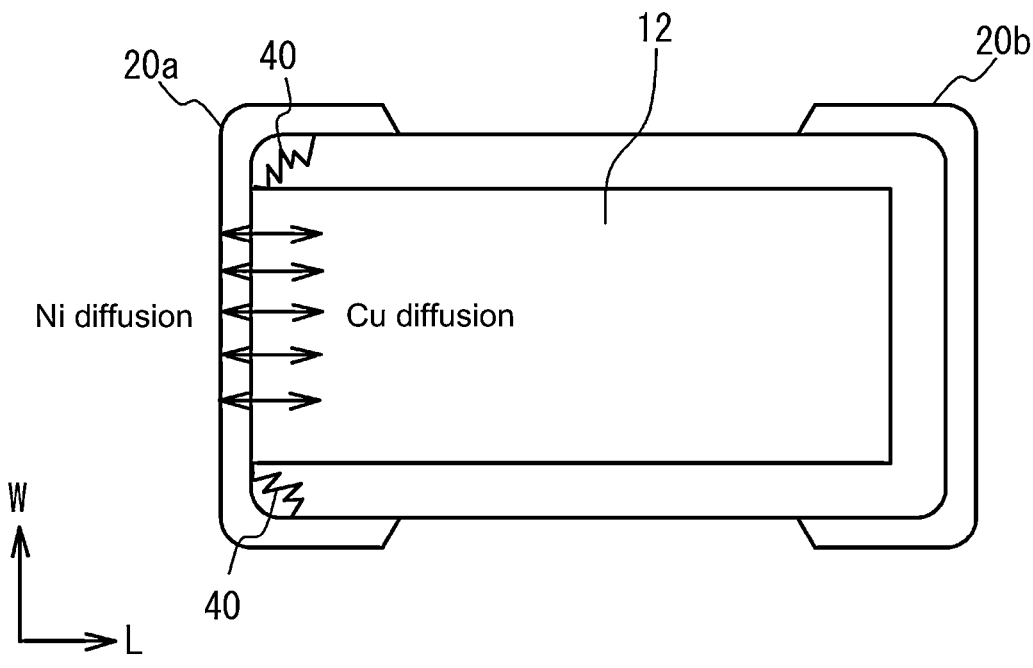
FIGS. 6A and 6B are diagrams illustrating element diffusion.
Figure 6B:
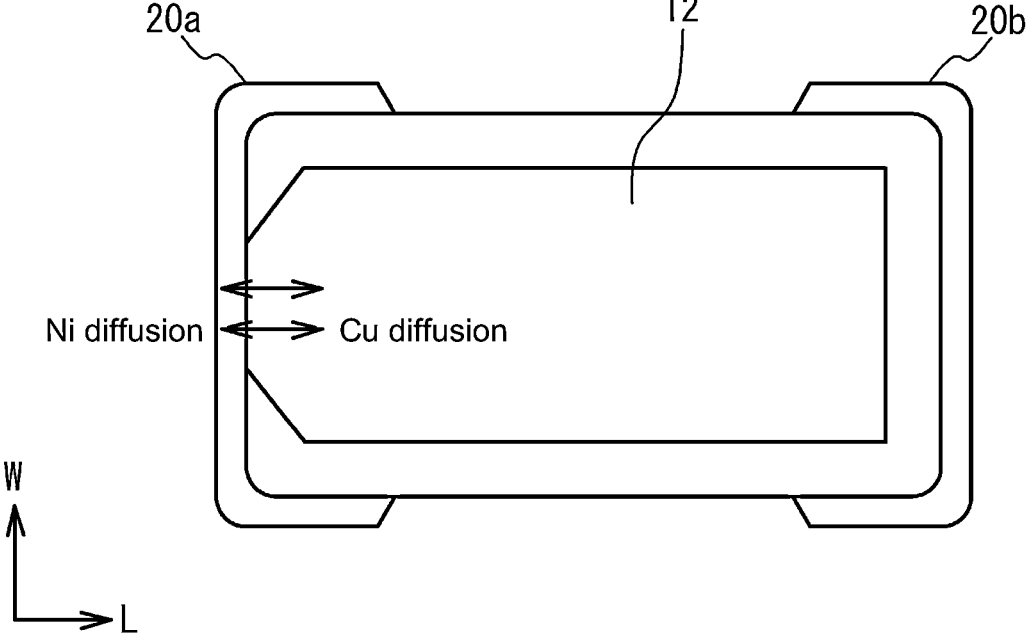

However, as illustrated in FIG. 6A, cracks 40 may occur due to elemental diffusion between the external electrodes 20a, 20b and the internal electrode layer 12. Therefore, as illustrated in FIG. 6B, it is conceivable to shape the internal electrode layer 12 so that the contact area between the internal electrode layer 12 and the external electrodes 20a and 20b becomes small. This shape makes it possible to suppress element diffusion between the external electrodes 20a, 20b and the internal electrode layer 12. However, when trying to reduce the contact area between the internal electrode layer 12 and the external electrodes 20a and 20b, the area where the internal electrode layer 12 does not exist increases in a plan view when viewed from the T direction, resulting in a local insufficient filling rate.

Figures 7A, 7B:
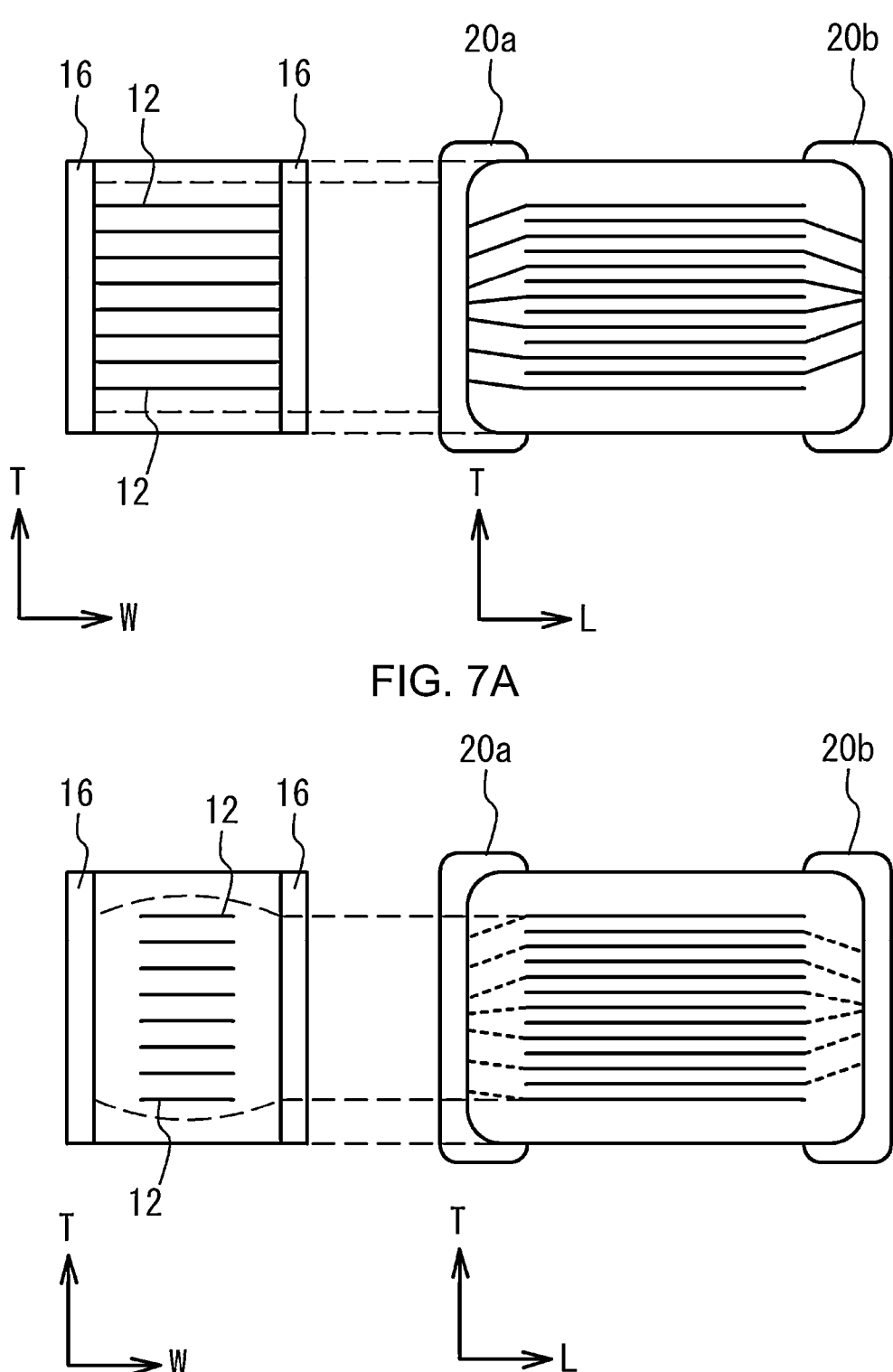
FIGS. 7A and 7B are diagrams illustrating local filling rate reduction.

Hereinafter, the local filling rate reduction will be explained. The left diagram in FIG. 7A is a diagram illustrating the first end surface of the multilayer chip 10 in the case where the contact area between the internal electrode layer 12 and the external electrodes 20a, 20b is not reduced. In this case, since the internal electrode layer 12 connected to the external electrode 20b does not extend to the first end surface, as shown in the right diagram of FIG. 7A, the filling rate near the end margin 15 on the side of the first end surface decreases. As a result, in the multilayer chip 10, a height difference occurs between the height at the first end surface and the height at the center in the L direction. However, as illustrated in the left diagram of FIG. 7A, each internal electrode layer 12 extends to the side margins 16 in the W direction. Therefore, a decrease in the filling rate can be suppressed, and the height difference can be made relatively small. Note that FIG. 7A is a diagram for explaining the filling rate and is schematically illustrated, so that the number of layers of the internal electrode layers 12 is different from FIG. 2 and the like. The same applies to FIG. 7B.

On the other hand, when the contact area between the internal electrode layers 12 and the external electrodes 20a and 20b is reduced, as illustrated in the left diagram of FIG. 7B, the proportion of the internal electrode layer 12 on the first end surface of the multilayer chip 10 is further reduced. In this case, since the internal electrode layer 12 connected to the external electrode 20b also does not extend to the first end surface, the filling rate near the end margin 15 on the first end surface side shown in the right diagram of FIG. 7B will further decline. As a result, the height difference between the height at the first end surface and the height at the center in the L direction becomes larger. In this case, the portion without internal electrodes is recessed, and accordingly, it may be difficult to maintain rectangularity. Furthermore, due to the distorted structure as described above, when applying the external electrode, there is a risk that it will be cut at the ridges and the like, resulting in a defective product. The influence of this local reduction in filling rate is particularly noticeable in a tall structure where height $T_0 \geq$ width $W_0 \times 1.3$.

Therefore, the multilayer ceramic capacitor 100 according to the present embodiment has the following configuration so as to suppress the occurrence of defects due to shape deformation.

Figure 8A:
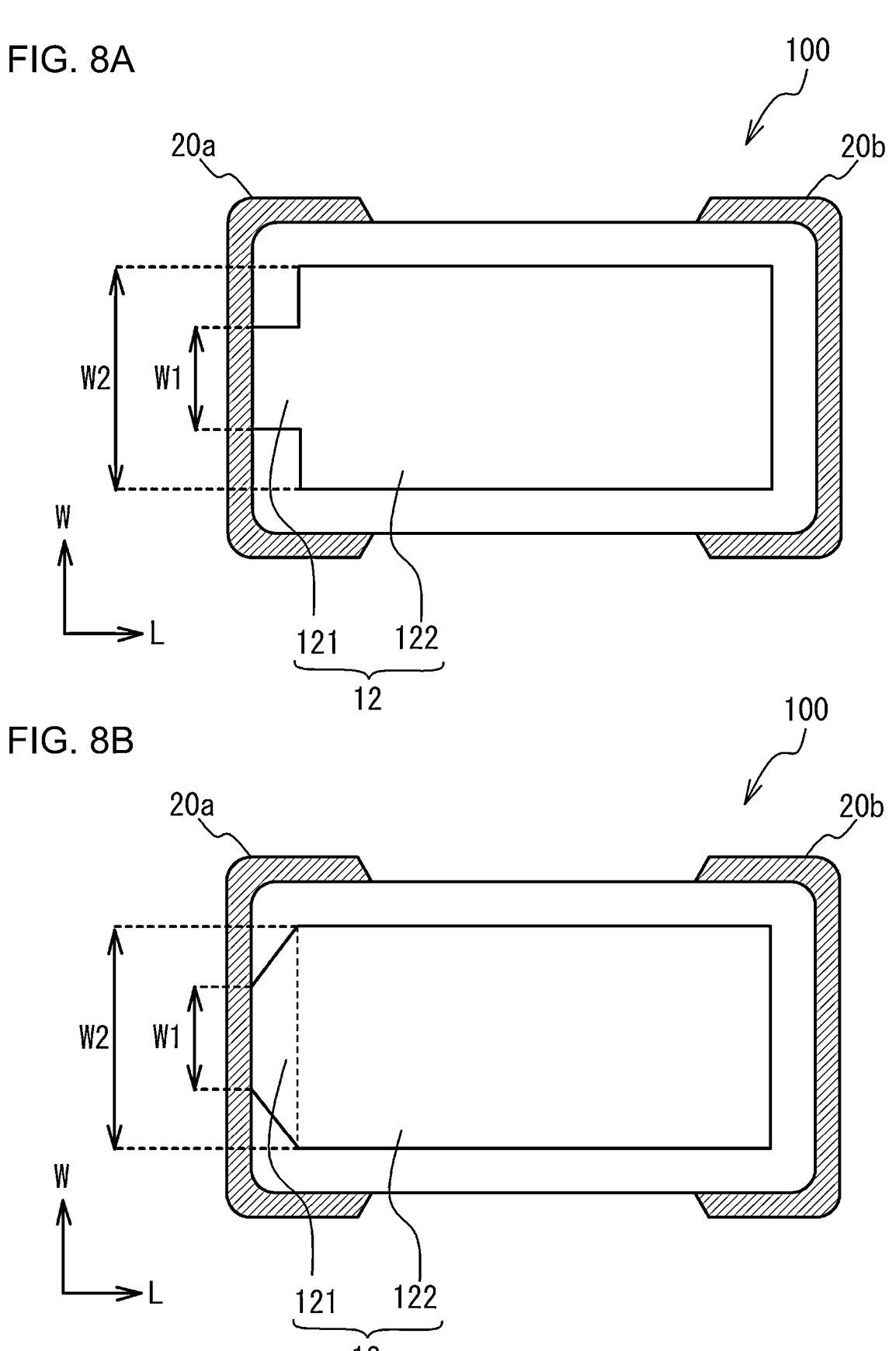

First, the width of the internal electrode layer 12 is varied. As illustrated in FIG. 8A, the internal electrode layer 12 connected to the external electrode 20a has a first region 121 (connecting portion) connected to the external electrode 20a in a region corresponding to the end margin 15 and having a width W1 and a second region 122 having a width W2 in the region corresponding to the capacitor section 14. Width W1 is smaller than width W2. The width W1 and the width W2 are widths in the W direction. The width W1 corresponds to the minimum width of the internal electrode layer 12 in the W direction. According to this configuration, since the travelling distance from the external electrodes 20a, 20b to the internal electrode layer 12 becomes longer at the corner portions, element diffusion between the external electrodes 20a, 20b and the internal electrode layer 12 is suppressed. Thereby, the occurrence of cracks 40 is suppressed. Also in the internal electrode layers 12 connected to the external electrode 20b, it is preferable that a first region 121 having a width W1 and a second region 122 having a width W2 are provided.

As illustrated in FIG. 8B, the width of the first region 121 may gradually or stepwise decrease from the second region 122 side toward the external electrode to be connected. In this case as well, since the travelling distance from the external electrodes 20a, 20b to the internal electrode layer 12 becomes longer at the corner portions, element diffusion from the external electrodes 20a, 20b to the internal electrode layer 12 is suppressed. Thereby, the occurrence of cracks 40 is suppressed. It is preferable that the internal electrode layer 12 connected to the external electrode 20b also has a similar shape.

Figure 9A:
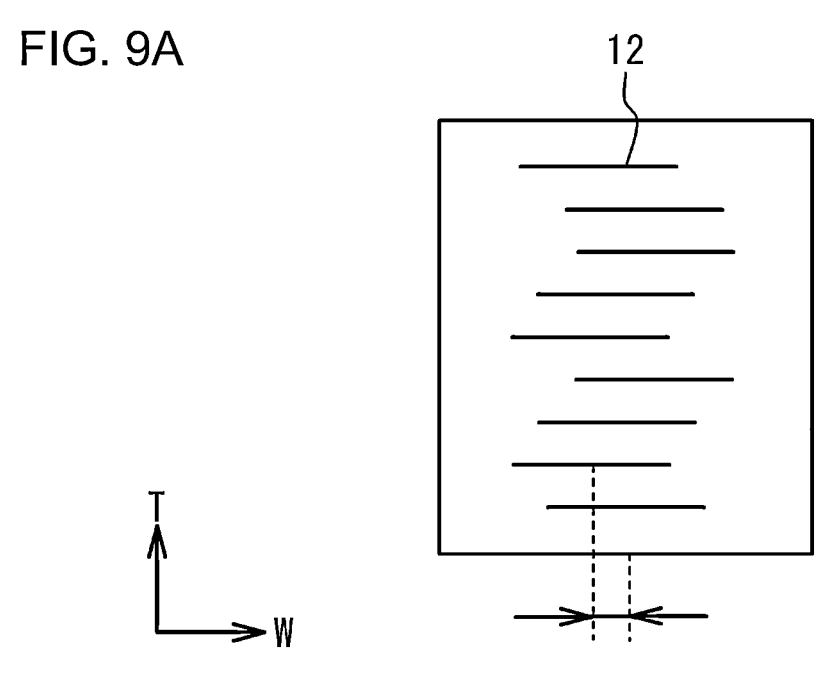
FIG. 9A is a diagram illustrating the first or second end surface of the multilayer chip.
Figure 9B:
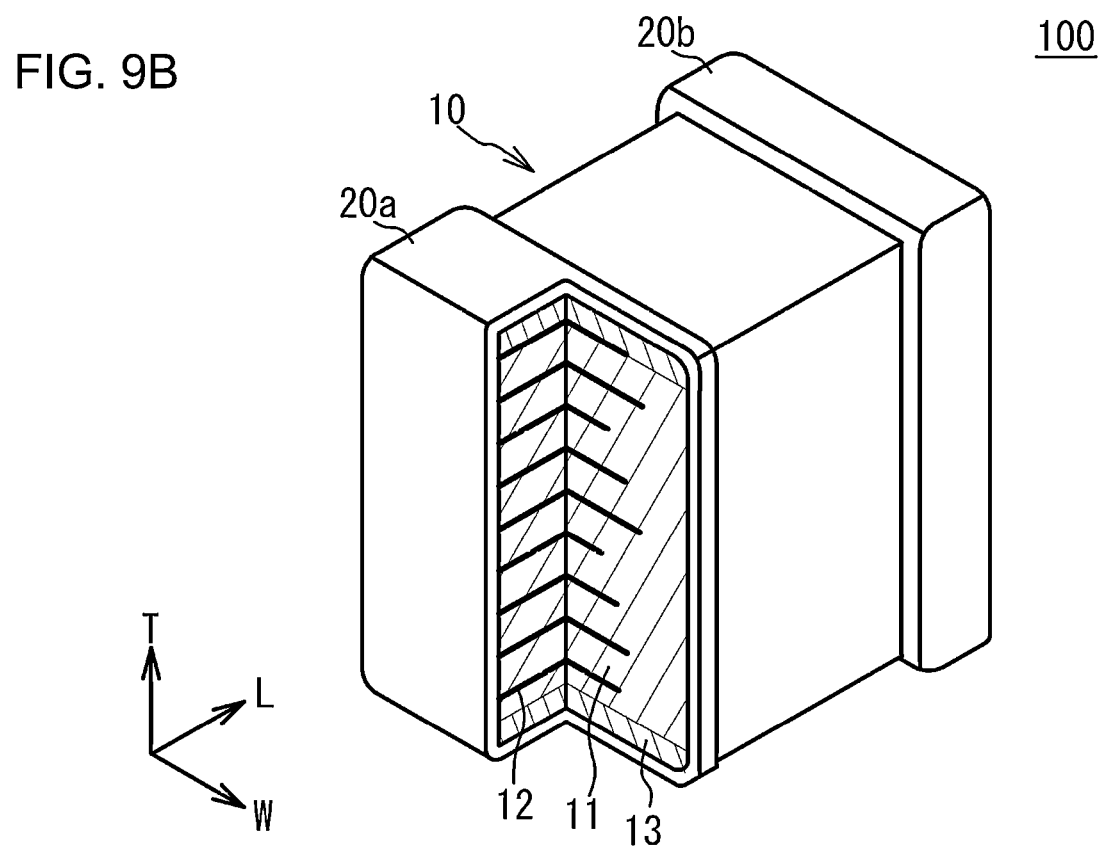
FIG. 9B is a partial cross-sectional perspective view at the end margin.

Furthermore, in at least two adjacent internal electrode layers 12, the side edges of the respective internal electrode layers 12 in the W direction on the first end surface are shifted in position from each other. FIG. 9A is a diagram illustrating the first end surface or the second end surface of the multilayer chip 10. FIG. 9B is a partial cross-sectional perspective view of the end margin on the external electrode 20a side. According to this configuration, the locations where the internal electrode layer 12 is not present are dispersed, and the locations where the filling density is low are dispersed, so that it is possible to suppress the occurrence of local cracks. Furthermore, since the locations where the filling density is low are dispersed, the rectangularity of the multilayer chip 10 is improved. Thereby, peeling of the side margin 16 can be suppressed, the shapes of the external electrodes 20a and 20b are improved, and defects during mounting can be suppressed. Therefore, the occurrence of defects due to shape deformation can be suppressed.

From the viewpoint of dispersing locations where the filling density is low, it is preferable to set a lower limit on the amount of displacement of the internal electrode layer 12 in the W direction. For example, the amounts of shifts between the center of the multilayer chip 10 in the W direction and the centers of the respective internal electrode layers 12 in the W direction may be measured at 10 points, and the average value of the measured amounts of shifts can be denoted as D. The average value of the widths of the internal electrode layers 12 on the first end surface of the multilayer chip 10 may be denoted as H. Then, to set such a lower limit, D/H is preferably set to 10% or more, more preferably 30% or more, and even more preferably 40% or more.

On the other hand, if D/H is too large, local distortion between each internal electrode layer 12 near the first end surface of the multilayer chip 10 will become large. As a result, a short circuit may occur, and reliability may deteriorate. Therefore, it is preferable to set an upper limit on D/H. In this embodiment, D/H is preferably 75% or less, more preferably 70% or less, and even more preferably 60% or less.

If the width W1 in the first region 121 is not sufficiently small, there is a possibility that elemental diffusion between the internal electrode layer 12 and the external electrodes 20a, 20b cannot be sufficiently suppressed. Therefore, it is preferable to set an upper limit on the ratio of the width W1 to the width W2. In this embodiment, the ratio of the width W1 to the width W2 (W1/W2) is preferably 80% or less, more preferably 70% or less, and even more preferably 60% or less.

On the other hand, if the width W1 in the first region 121 is too small, there is a risk of a decrease in capacitance due to poor contact with the external electrode. Therefore, it is preferable to set a lower limit on the ratio of the width W1 to the width W2. In this embodiment, the ratio of the width W1 to the width W2 (W1/W2) is preferably 20% or more, more preferably 30% or more, and even more preferably 40% or more.

In order to achieve high capacitance, it is preferable that the height $T_0 \geq$ width $W_0 \times 1.5$, and more preferably that the height $T_0 \geq$ width $W_0 \times 1.7$.

Figure 10:
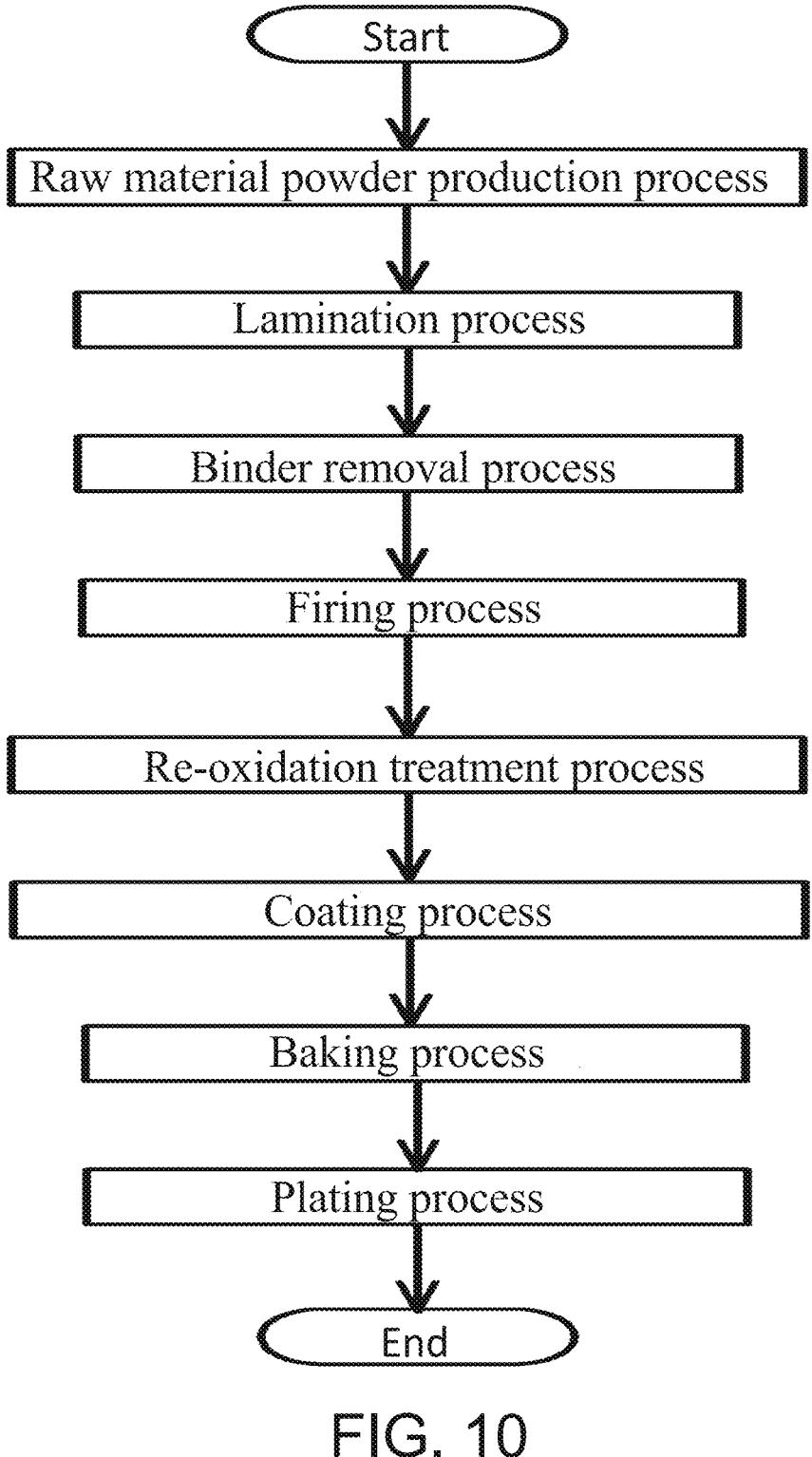
FIG. 10 is a diagram illustrating a flow of a method for manufacturing a multilayer ceramic capacitor.

Next, a method for manufacturing the multilayer ceramic capacitor 100 will be described. FIG. 10 is a diagram illustrating a flow of a method for manufacturing the multilayer ceramic capacitor 100.

(Raw Material Powder Production Process)

First, a dielectric material for forming the dielectric layer 11 is prepared. The A-site element and the B-site element contained in the dielectric layer 11 are usually contained in the dielectric layer 11 in the form of a sintered body of $ABO_3$ particles. For example, $BaTiO_3$ is a tetragonal compound having a perovskite structure and exhibits a high dielectric constant. This $BaTiO_3$ can generally be obtained by reacting a titanium raw material such as titanium dioxide with a barium raw material such as barium carbonate to synthesize barium titanate. Various methods are conventionally known for synthesizing the main component ceramic of the dielectric layer 11, such as a solid phase method, a sol-gel method, and a hydrothermal method. In this embodiment, any of these can be adopted.

A desirable additive compound may be added to the obtained ceramic powder depending on purposes. Examples of additive compounds include Mg, Mn, Mo, V, Cr, oxides of rare earth elements (Y, Sm, Eu, Gd, Tb, Dy, Ho, Er, Tm and Yb), or oxides containing Co, Ni, Li, B, Na, K, or Si, or glasses containing Co, Ni, Li, B, Na, K, or Si. Among these, $SiO_2$ mainly functions as a sintering aid.

For example, a ceramic material is prepared by wet-mixing a compound containing an additive compound with a ceramic raw material powder, drying and pulverizing the mixture. For example, the ceramic material obtained as described above may be pulverized to adjust the particle size, if necessary, or may be combined with a filtering process to adjust the particle size. Through the above steps, a dielectric material is obtained.

(Lamination Process)

Next, a binder such as polyvinyl butyral (PVB) resin, an organic solvent such as ethanol or toluene, and a plasticizer are added to the obtained raw material powder and wet-mixed. Using the obtained slurry, a dielectric green sheet is applied onto a base material by, for example, a die coater method or a doctor blade method, and then dried. The base material is, for example, a polyethylene terephthalate (PET) film.

Next, an internal electrode pattern 52 having a width W1 and a width W2 is formed on the dielectric green sheet 51. The width W2 is made to match the width of the dielectric green sheet 51 in the W direction. The dielectric green sheet 51 on which the internal electrode pattern 52 is formed is a unit of lamination. The film forming method may be printing, sputtering, vapor deposition, or the like.

Figure 11:
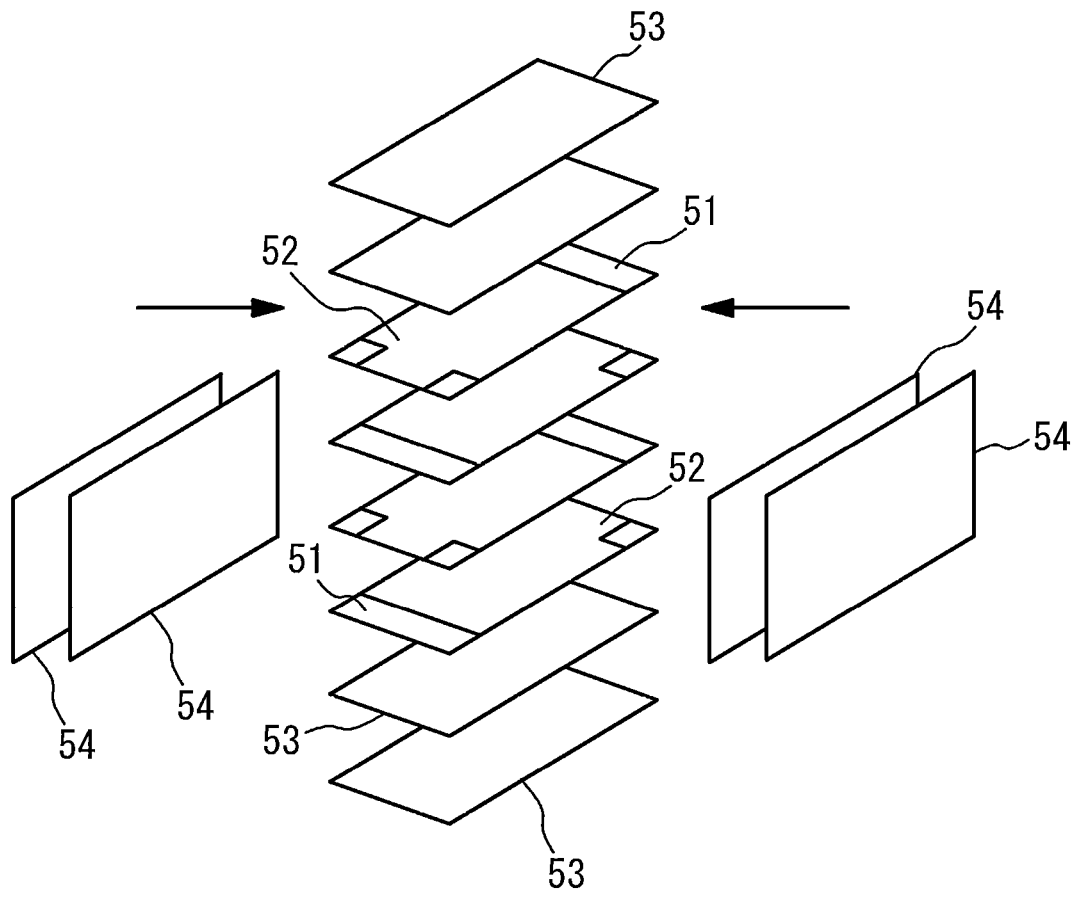
FIG. 11 is a figure which illustrates a lamination process.

Next, while peeling the dielectric green sheet 51 from the base material, the units of lamination are laminated as illustrated in FIG. 11. In this case, at least any two adjacent layers of internal electrode patterns 52 are stacked such that the side edges of the internal electrode patterns 52 in the W direction are shifted in position from each other on the end surface corresponding to the first end surface of the multilayer chip 10. Further, in the multilayer ceramic capacitor 100 after firing, the number of laminated layers is adjusted so that height $T_0 \geq$ width $W_0 \times 1.3$. Next, a predetermined number (for example, 2 to 10 layers) of cover sheets 53 are laminated on the upper and lower sides, respectively, of the laminate obtained by laminating the laminate units, and are bonded by thermocompression. The cover sheet 53 can be formed by the same method as the dielectric green sheet 51.

Next, a plurality of side margin sheets 54 are attached to the respective sides of the laminate. The side margin sheet 54 can be formed by the same method as the dielectric green sheet 51.

(Binder Removal Process)

The thus obtained laminate is subjected to binder removal treatment in an $N_2$ atmosphere. The heat treatment temperature is about 250° C. to 700° C., and the heat treatment time is about 5 minutes to 1 hour.

(Firing Process)

Thereafter, the resulting structure is baked at 1100° C. to 1300° C. for 10 minutes to 2 hours in a reducing atmosphere with an oxygen partial pressure of $10^{-5}$ to $10^{-8}$ atm. In this way, the multilayer chip 10 is obtained.

(Re-Oxidation Treatment Process)

Thereafter, reoxidation treatment may be performed at 600° C. to 1000° C. in an $N_2$ gas atmosphere.

(Coating Process)

Next, a metal paste that will become the base layer 21 is applied to the first side surface of the laminate using a dipping method or the like. This metal paste contains a glass component such as glass frit.

(Baking Process)

Next, the base layer 21 is formed by baking the metal paste at a temperature of approximately 700° C. to 900° C.

(Plating Process)

Thereafter, a metal coating such as copper, nickel, tin, etc., may be applied to the base layer 21 by plating. For example, the first plating layer 23, the second plating layer 24, and the third plating layer 25 are formed in this order on the base layer 21. Thereby, the multilayer ceramic capacitor 100 is completed.

According to the manufacturing method of the present embodiment, since the height $T_0 \geq$ width $W_0 \times 1.3$, the number of stacked layers increases. With this configuration, the total opposing area of the internal electrode layers 12 increases, and so a large capacitance can be achieved. Furthermore, since the width W1 is smaller than the width W2, element diffusion between the external electrodes 20a, 20b and the internal electrode layer 12 is suppressed. Thereby, the occurrence of cracks 40 is suppressed. Furthermore, in at least two adjacent layers of internal electrode patterns 52, the side edges of the internal electrode patterns 52 in the W direction on the first end surface are shifted in position from each other. As a result, the locations where the filling density is low are dispersed, and so it is possible to suppress the occurrence of local cracks. In addition, the rectangularity of the laminate is improved by dispersing the locations where the filling density is low. As a result, peeling of the side margin sheet 54 can be suppressed, and the shape of the external electrodes 20a, 20b is improved, and defects during mounting, such as the multilayer ceramic capacitor falling down and the external electrode on one side floating due to the tombstone phenomenon, can be prevented. Thus, the occurrence of defects due to shape deformation can be suppressed.

Note that in the above manufacturing method, the base layer 21 is baked after the multilayer chip 10 is baked, but the method is not limited thereto. For example, when the multilayer chip 10 is fired, the base layer 21 may be fired at the same time.

Figure 12:
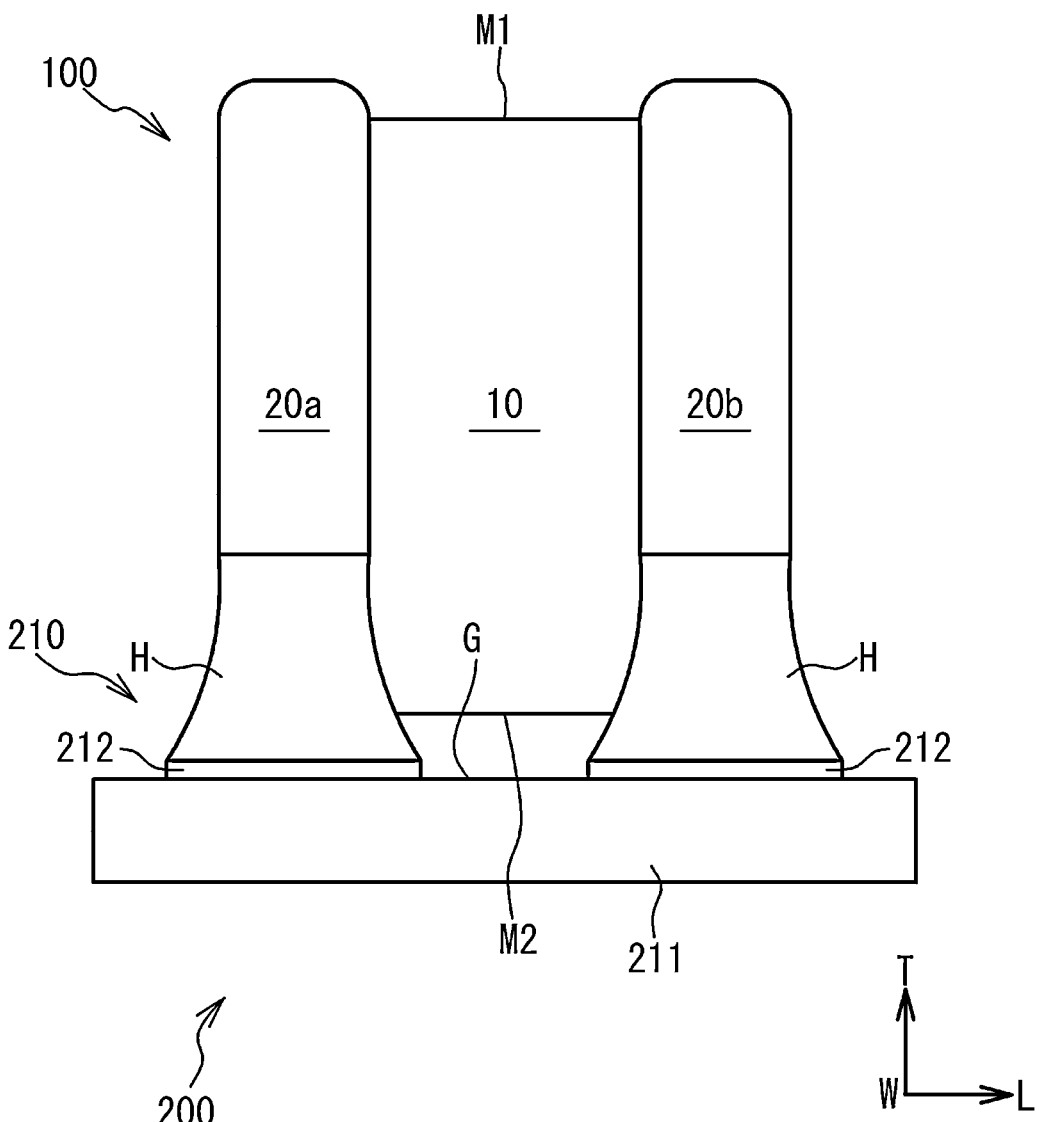
FIG. 12 is a side view of a circuit board including a multilayer ceramic capacitor.

Here, mounting of the multilayer ceramic capacitor 100 will be explained. FIG. 12 is a side view of a circuit board 200 including the multilayer ceramic capacitor 100. The circuit board 200 has a mounting board 210 on which the multilayer ceramic capacitor 100 is mounted. The mounting board 210 includes a base member 211 that extends along planes in the L direction and the W direction and has a mounting surface G perpendicular to the T direction, and a pair of connection electrodes 212 provided on the mounting surface G.

In the circuit board 200, the external electrodes 20a and 20b of the multilayer ceramic capacitor 100 are respectively connected to a pair of connection electrodes 212 of the mounting board 210 via solder H. Thereby, in the circuit board 200, the multilayer ceramic capacitor 100 is fixed to the mounting board 210 and is electrically connected.

Figure 13:
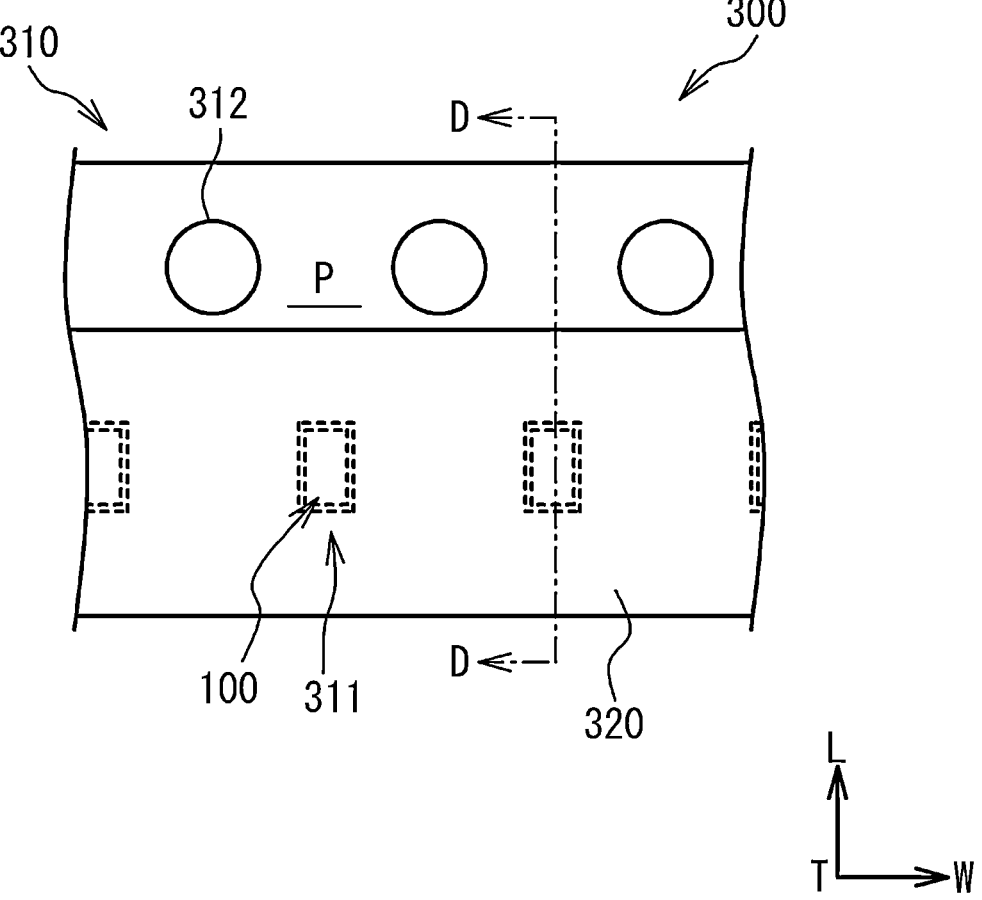
FIG. 13 is a partial plan view of a taped package.
Figure 14:
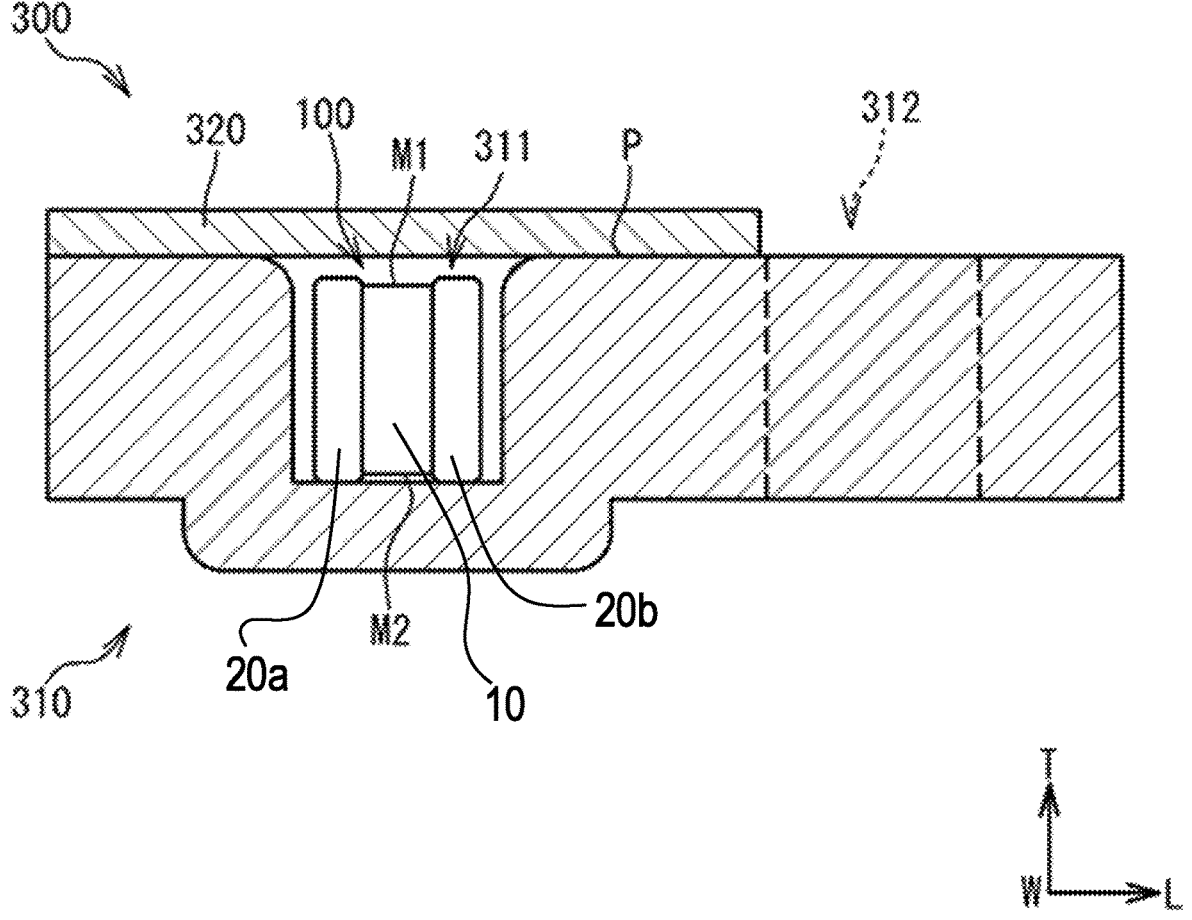
FIG. 14 is a cross-sectional view of the taped package taken along line D-D in FIG. 13.

The multilayer ceramic capacitor 100 is prepared in a taped packaged state as a taped package 300 when being mounted on the mounting board 210. FIGS. 13 and 14 are diagrams illustrating the taped package 300. FIG. 13 is a partial plan view of the taped package 300. FIG. 14 is a cross-sectional view of the taped package 300 taken along line D-D in FIG. 13.

The taped package 300 includes the multilayer ceramic capacitors 100, a carrier tape 310, and a top tape 320. The carrier tape 310 is configured as a long tape extending in the W direction. In the carrier tape 310, a plurality of recesses 311 for accommodating the respective multilayer ceramic capacitors 100 are arranged at intervals in the W direction.

The carrier tape 310 has a sealing surface P that is an upward facing surface orthogonal to the T direction, and the plurality of recesses 311 are depressed from the sealing surface P downward in the T direction. In other words, the carrier tape 310 is configured such that the multilayer ceramic capacitors 100 in the plurality of recesses 311 can be taken out from the sealing surface P side.

In the carrier tape 310, a plurality of sprocket holes 312 are provided at positions shifted in the L direction from the row of the plurality of recesses 311, and are arranged at intervals in the W direction and penetrate in the T direction. The sprocket hole 312 is configured as an engagement hole used by the tape transport mechanism to transport the carrier tape 310 in the W direction.

In the package 300, the top tape 320 is attached to the sealing surface P of the carrier tape 310 along the row of the plurality of recesses 311, and the plurality of recesses 311 containing the plurality of multilayer ceramic capacitors 100 are collectively covered and sealed by the top tape 320. As a result, the plurality of multilayer ceramic capacitors 100 are held within the plurality of recesses 311.

As shown in FIG. 14, in the multilayer ceramic capacitor 100 within the recess 311 of the carrier tape 310, the first main surface M1 of the multilayer chip 10 facing upward in the T direction faces the top tape 320. Further, the second main surface M2 of the multilayer chip 10 facing downward in the T direction faces the bottom surface of the recess 311.

When mounting the multilayer ceramic capacitor 100 packaged in the taped package 300, the top tape 320 is peeled off from the sealing surface P of the carrier tape 310 along the W direction. Thereby, in the taped package 300, the plurality of recesses 311 in which the plurality of multilayer ceramic capacitors 100 are housed can be sequentially opened upward in the T direction.

The multilayer ceramic capacitor 100 housed in the open recess 311 is taken out with the first main surface M1 of the multilayer chip 10 facing upward in the T direction being attracted to the tip of the suction nozzle of the mounting device. The mounting device moves the multilayer ceramic capacitor 100 onto the mounting surface G of the mounting board 210 by moving the suction nozzle.

Next, the mounting device stacks the multilayer chips 10 with the second main surface M2 facing the mounting surface G and with the external electrodes 20a and 20b aligned on the pair of connection electrodes 212 coated with solder paste. The suction by the suction nozzle on the first main surface M1 of the chip 10 is then released. Thereby, the multilayer ceramic capacitor 100 is placed on the mounting surface G.

Then, the solder paste is melted on the mounting board 210 on which the multilayer ceramic capacitor 100 is placed on the mounting surface G using a reflow oven, and then hardened. Thereby, the external electrodes 20a and 20b are connected to the pair of connection electrodes 212 of the mounting board 210 via the solder H, thereby obtaining the circuit board 200 shown in FIG. 12.

Note that in each of the above embodiments, a multilayer ceramic capacitor has been described as an example of a ceramic electronic component, but the present invention is not limited thereto. For example, the configurations of the above embodiments can also be applied to other multilayer ceramic electronic components such as varistors and thermistors.

Working examples of the multilayer ceramic capacitors according to the embodiments were manufactured and their characteristics were investigated.

Example 1

A dielectric green sheet was obtained by blending and coating a slurry containing $BaTiO_3$ as the main component. An internal electrode pattern was printed on each dielectric green sheet. Nickel powder was used for the internal electrode pattern. In each internal electrode pattern, the width W2 in the W direction was made large in the capacitor section, and the width W1 in the W direction was made smaller than W2 in the end margin. The width W2 of the internal electrode layer in the capacitive part was 240 m, and the dimension W1 of the internal electrode layer at the end margin was 150 m. 400 layers of the obtained laminated units were laminated to obtain a laminate.

A slurry containing $BaTiO_3$ as a main component was blended and applied to obtain a cover sheet and a side margin sheet. A plurality of cover sheets were stacked and pressure-bonded on each of the upper and lower sides of the laminate in the stacking direction, and a plurality of side margin sheets were attached to each of the side surfaces of the laminate. Thereafter, barrel polishing was performed and a binder removal process was performed. Thereafter, the resulting structure was fired and re-oxidized. A metal paste containing Cu as a main component was applied to two end surfaces of the obtained multilayer chip and baked at around 800° C. Through these steps, a multilayer ceramic capacitor having a length $L_0$: 0.6 mm, a width $W_0$: 0.3 mm, and a height $T_0$: 0.45 mm was manufactured.

In the fired multilayer ceramic capacitor, the thickness of each internal electrode layer in the T direction was 0.5 m, and the thickness of each dielectric layer in the T direction was 0.5 m. The thickness of each cover layer in the T direction was 25 m. The thickness of each side margin in the W direction was 15 m. D/H was 5.3%.

Example 2

In Example 2, D/H was 12.5%. Other conditions were the same as in Example 1.

Example 3

In Example 3, D/H was 29.5%. Other conditions were the same as in Example 1.

Example 4

In Example 4, D/H was 41.1%. Other conditions were the same as in Example 1.

Example 5

In Example 5, D/H was 59.8%. Other conditions were the same as in Example 1.

Example 6

In Example 6, D/H was 69.9%. Other conditions were the same as in Example 1.

Example 7

In Example 7, D/H was 74.8%. Other conditions were the same as in Example 1.

Example 8

In Example 8, D/H was 85.2%. Other conditions were the same as in Example 1.

Comparative Example

In the comparative example, D/H was 0%. Other conditions were the same as in Example 1.

(Fire Crack Occurrence Rate)

100 samples of each of Examples 1 to 8 and Comparative Example were examined to see if cracks were generated after firing. When the crack occurrence rate was 1% or less, it was judged as good "○". When the crack occurrence rate was more than 1% and less than 10%, it was judged as fair "Δ". When the crack occurrence rate exceeded 10%, it was determined to be defective "x". The results are shown in Table 1.

As shown in Table 1, all of Examples 1 to 8 were rated as slightly good "Δ" or good "○". This is considered to be because even in the configuration where the height $T_0 \geq$ width $W_0 \times 1.3$, the width W1 was made smaller than the width W2 and the positions of the first regions 121 in the W direction was shifted.

(SAP Defective Rate)

100 samples of each of Examples 1 to 8 and Comparative Example were examined to see if peeling occurred in the side margins. When the rate of peeling on the side margin (SAP defective rate) was 1% or less, it was judged as good "○". When the SAP defect rate was more than 1% and less than 10%, it was judged as slightly good "fair". When the SAP defective rate exceeded 10%, it was determined to be defective "x". The results are shown in Table 1.

As shown in Table 1, all of Examples 1 to 8 were rated as slightly good "Δ" or good "○". This is considered to be because even in the configuration where the height $T_0 \geq$ width $W_0 \times 1.3$, the width W1 was made smaller than the width W2 and the positions of the first regions 121 in the W direction were shifted.

(External Shape Defective Rate)

100 samples of each of Examples 1 to 8 and Comparative Example were examined to see if any defects occurred in the shape of the external electrodes. When the external conductor shape defect rate was 1% or less, it was judged as good "○". When the external electrical shape defect rate was more than 1% and less than 10%, it was judged as slightly good "Δ". When the external conductor shape defective rate exceeded 10%, it was determined to be defective "x". The results are shown in Table 1.

As shown in Table 1, all of Examples 1 to 8 were rated as slightly good "Δ" or good "○". This is considered to be because even in the configuration where the height $T_0 \geq$ width $W_0 \times 1.3$, the width W1 was made smaller than the width W2 and the positions of the first regions 121 in the W direction were shifted.

(Short Defective Rate)

100 samples of each of Examples 1 to 8 and Comparative Example were examined to see if short-circuit defects occurred. When the short-circuit defect rate was 5% or less, it was judged as good "○". When the short-circuit defect rate was more than 5% and less than 10%, it was judged as slightly good "Δ". When the short-circuit failure rate exceeded 10%, it was determined to be defective "x". The results are shown in Table 1.

As shown in Table 1, all of Examples 1 to 8 were rated as slightly good "Δ" or good "○". This is considered to be because even in the configuration where the height $T_0 \geq$ width $W_0 \times 1.3$, the width W1 was made smaller than the width W2 and the positions of the first regions 121 in the W direction were shifted.

(High Temperature Load Test)

1000 samples of each of Examples 1 to 8 and Comparative Example were examined to see if failure occurred in a high temperature load test. The high-temperature load test was conducted at a temperature of 85° C. to determine whether a failure occurred after 1000 hours. When the failure rate was less than 0.5%, it was judged as good "○". When the failure rate was more than 0.5% and less than 1%, it was judged as slightly good "Δ". When the failure rate exceeded 1%, it was determined to be defective "x". The results are shown in Table 1.

As shown in Table 1, all of Examples 1 to 8 were rated as slightly good "Δ" or good "○". This is considered to be because even in the configuration where the height $T_0 \geq$ width $W_0 \times 1.3$, the width W1 was made smaller than the width W2 and the positions of the first regions 121 in the W direction were shifted.

(Moisture Resistance Test)

1000 samples of each of Examples 1 to 8 and Comparative Example were tested to see if any failure occurred in a moisture resistance test. In the moisture resistance test, it was determined whether a failure occurred after 1000 hours at a temperature of 85° C. and a humidity of 85%. When the failure rate was less than 0.5%, it was judged as good "○".

When the failure rate was more than 0.5% and less than 12%, it was judged as slightly good "Δ". When the failure rate exceeded 12%, it was determined to be defective "x". The results are shown in Table 1.

As shown in Table 1, all of Examples 1 to 8 were rated as slightly good "Δ" or good "○". This is considered to be because the width W1 was made smaller than the width W2, the positions of the first regions 121 in the W direction were shifted, and the D/H was made 75% or less.

TABLE 1

| | D/H (%) | Firing crack | SAP defective rate | Outside electric shape defective rate | Short-circuit defective rate | High temperature load test failure rate | Moisture test failure rate |
|---|---|---|---|---|---|---|---|
| Comparative example | 0 | X 95/100 | X 53/100 | X 45/100 | X 11/100 | X 15/1000 | X 25/1000 |
| Example 1 | 5.3 | Δ 5/100 | Δ 9/100 | Δ 10/100 | Δ 8/100 | Δ 5/1000 | Δ 5/1000 |
| Example 2 | 12.5 | ○ 0/100 | Δ 3/100 | Δ 9/100 | ○ 0/100 | ○ 0/1000 | ○ 2/1000 |
| Example 3 | 29.5 | ○ 0/100 | ○ 1/100 | ○ 0/100 | ○ 1/100 | ○ 0/1000 | ○ 1/1000 |
| Example 4 | 41.1 | ○ 0/100 | ○ 0/100 | ○ 2/100 | ○ 2/100 | ○ 0/1000 | ○ 0/1000 |
| Example 5 | 59.8 | ○ 0/100 | ○ 0/100 | ○ 6/100 | ○ 0/100 | ○ 0/1000 | ○0/1000 |
| Example 6 | 69.9 | ○ 0/100 | ○ 0/100 | ○ 3/100 | ○ 3/100 | ○ 1/1000 | Δ 7/1000 |
| Example 7 | 74.8 | ○ 0/100 | ○ 0/100 | ○ 0/100 | Δ 6/100 | Δ 5/1000 | Δ 8/1000 |
| Example 8 | 85.2 | ○ 0/100 | ○ 0/100 | ○ 0/100 | Δ 9/100 | Δ 7/1000 | Δ 11/1000 |

Note that in the above embodiments, the external electrode was structured by coating on six sides, but the same effect can be obtained by coating in a U-shape (four sides) or in an L-shape (two sides).

Although the embodiments of the present invention have been described in detail above, it will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A ceramic electronic component, a dimension in a first direction of the ceramic electronic component being equal to or greater than 1.3 times a dimension of the ceramic electronic component in a second direction that is perpendicular to the first direction, the ceramic electronic component comprising:

a multilayer chip having a substantially rectangular parallelepiped shape in which a plurality of dielectric layers and a plurality of internal electrode layers are alternately stacked in the first direction, the plurality of internal electrode layers being alternately exposed to a first end surface and a second end surface, respectively, the first end surface and the second end surface facing each other in a third direction that is perpendicular to the first and second directions; and a pair of external electrodes provided on the first end surface and the second end surface, respectively, wherein in each of the plurality of internal electrode layers, a width of a connecting portion thereof connected to the corresponding external electrode in the second direction is narrower than a width of other regions of the internal electrode layer, and wherein in at least two adjacent internal electrode layers, among the plurality of internal electrode layers, that are connected to the same one of the pair of external electrodes, side edges of the connecting portions in the second direction are shifted in position with respect to each other in the second direction, the connecting portions of said at least two adjacent internal electrode layers being overlapping with each other in a plan view.

2. The ceramic electronic component according to claim 1, wherein D/H is 10% or more and 75% or less, where D is an average value of amounts of positional shifts between a center of the multilayer chip in the second direction and a center of the connecting portions of the plurality of internal electrode layers in the second direction, and H is an average value of the widths of the connecting portions of the plurality of internal electrode layers in the second direction.

3. The ceramic electronic component according to claim 1, wherein in each of the plurality of internal electrode layers, the width of the connecting portion is 20% or more and 80% or less of a width of the internal electrode layer in an area where the internal electrode layers connected to different external electrodes face each other.

4. The ceramic electronic component according to claim 1, wherein a main component of the plurality of internal electrode layers is nickel, and in each of the pair of external electrodes, a main component of a portion of the external electrode in contact with the first end surface or the second end surface is copper.

5. The ceramic electronic component according to claim 1, wherein the side edges of the connecting portions of every two of the plurality of internal electrode layers are shifted in position alternately in the second direction and in a direction opposite to the second direction.

6. A taped package, comprising:

the ceramic electronic component as set forth in claim 1;

a carrier tape having a sealing surface perpendicular to the first direction, and a recess that is recessed from the sealing surface in the first direction and that accommodates the ceramic electronic component; and a top tape affixed to the sealing surface and covering the recess.

7. A circuit board, comprising:

the ceramic electronic component as set forth in claim 1; and a mounting board having a mounting surface perpendicular to the first direction, and a pair of connection electrodes provided on the mounting surface to which the pair of external electrodes of the ceramic electronic component are respectively connected via solder.

8. The ceramic electronic component according to claim 1, wherein D/H is 5.3% or more and 41.1% or less, where D is an average value of amounts of positional shifts between a center of the multilayer chip in the second direction and a center of the connecting portions of the plurality of internal electrode layers in the second direction, and H is an average value of the widths of the connecting portions of the plurality of internal electrode layers in the second direction.

9. The ceramic electronic component according to claim 1, wherein in each of the plurality of internal electrode layers, the width of the connecting portion thereof connected to the corresponding external electrode in the second direction gradually decreases toward the corresponding external electrode.

* * * * *